(12) United States Patent
Kumagai et al.

(10) Patent No.: US 7,476,935 B2
(45) Date of Patent: Jan. 13, 2009

(54) HIGH POWER SEMICONDUCTOR DEVICE HAVING A SCHOTTKY BARRIER DIODE

(75) Inventors: Naoki Kumagai, Nagano (JP); Yuuichi Harada, Nagano (JP); Shinichi Jimbo, Nagano (JP); Yoshihiro Ikura, Nagano (JP); Tatsuhiko Fujihira, Nagano (JP); Kazuhiko Yoshida, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 11/054,856

(22) Filed: Feb. 10, 2005

(65) Prior Publication Data

US 2005/0145975 A1  Jul. 7, 2005

Related U.S. Application Data

(62) Division of application No. 10/301,489, filed on Nov. 21, 2002, now Pat. No. 6,870,223.

(30) Foreign Application Priority Data

Nov. 21, 2001 (JP) .............................. 2001-355798
Sep. 9, 2002 (JP) .............................. 2002-262230

(51) Int. Cl.
    *H01L 29/78* (2006.01)
(52) U.S. Cl. ................. 257/343; 257/492; 257/E29.256
(58) Field of Classification Search ................. 257/327, 257/328, 335–343, 492, 493
    See application file for complete search history.

(56) References Cited

U.S. PATENT DOCUMENTS

| | | | | |
|---|---|---|---|---|
| 4,811,065 A | * | 3/1989 | Cogan | ......................... 257/328 |
| 5,286,995 A | * | 2/1994 | Malhi | .......................... 257/549 |
| 5,917,217 A | * | 6/1999 | Kitamura et al. | ............. 257/343 |
| 5,925,910 A | * | 7/1999 | Menegoli | ..................... 257/335 |
| 6,133,107 A | | 10/2000 | Menegoli | |
| 6,242,787 B1 | | 6/2001 | Nakayama et al. | |

FOREIGN PATENT DOCUMENTS

| | | |
|---|---|---|
| JP | 08-107202 A | 4/1996 |
| JP | 08-130249 A | 5/1996 |
| JP | 09-055507 A | 2/1997 |
| JP | 10-284731 A | 10/1998 |

OTHER PUBLICATIONS

Notification of Reasons for Refusal, dated Oct. 9, 2008, issued in corresponding JP application No. 2002-262230.

* cited by examiner

*Primary Examiner*—Marcos D. Pizarro
(74) *Attorney, Agent, or Firm*—Rossi, Kimms & McDowell, LLP (57) ABSTRACT

A semiconductor device is configured to prevent destruction of elements and/or miss-operation of the circuit by parasitic effects produced by parasitic transistors when a MOSFET of a bridge circuit is formed on a single chip. A Schottky junction is formed by providing an anode electrode in an n well region where a source region, a drain region, and a p well region of a lateral MOSFET. A Schottky barrier diode constituting a majority carrier device is connected in parallel with a PN junction capable of being forward-biased so that the PN junction is not forward-biased so that minority carriers are not generated, and thereby suppressing parasitic effects.

5 Claims, 10 Drawing Sheets

HIGH POWER SEMICONDUCTOR DEVICE HAVING A SCHOTTKY BARRIER DIODE

This application is a divisional of U.S. application Ser. No. 10/301,489 filed on Nov. 21, 2002, now U.S. Pat. No. 6,870,223.

BACKGROUND

Figure 9:
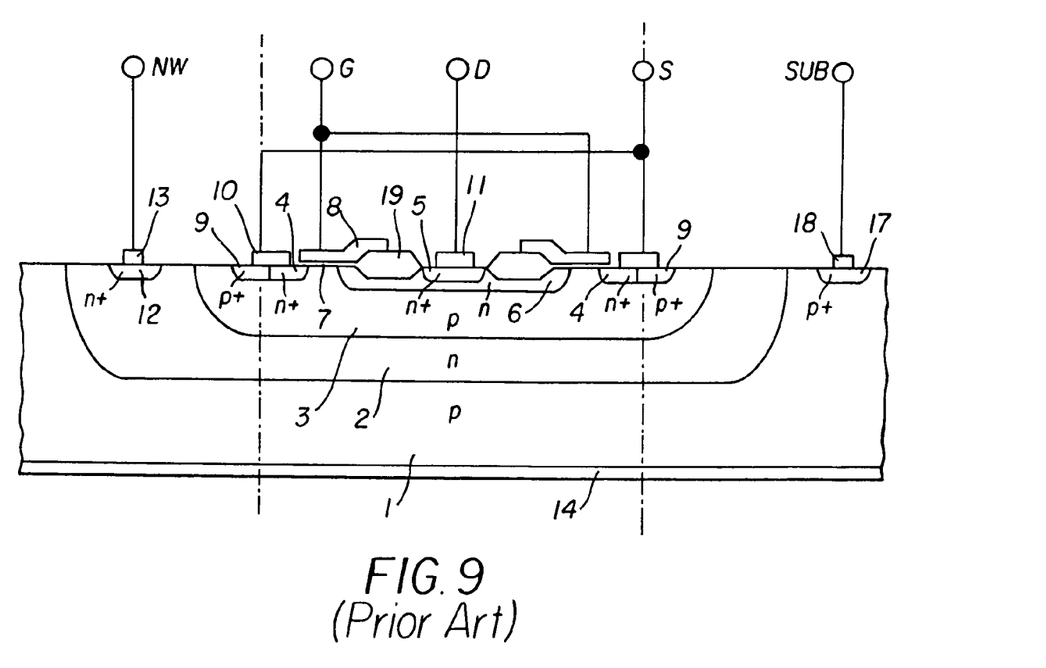
FIG. 9 is a cross-sectional constructional view of a prior art MOSFET.
Figure 10:
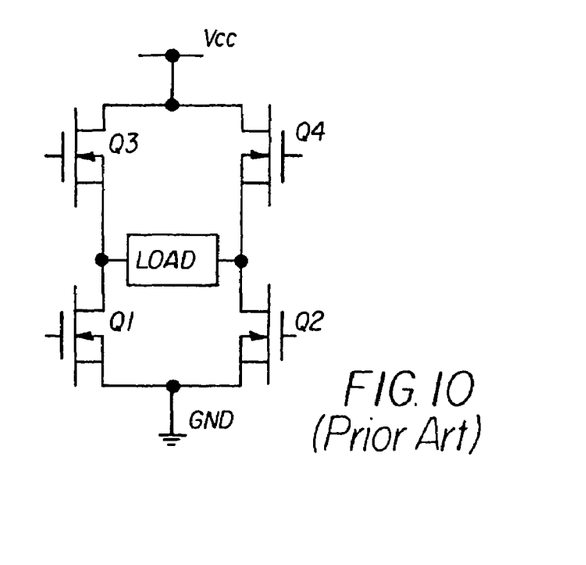
FIG. 10 is a circuit layout diagram illustrating application of the prior art MOSFET to a bridge circuit.

FIG. 10 is a cross-sectional constructional diagram of a MOSFET constituting a power semiconductor element employed in the output stage of a prior art intelligent switching device. In FIG. 10, an n well region 2 is formed at the surface of a p type semiconductor substrate 1 and a p well region 3 is formed at the surface of the n well region 2. An n+ source region 4 and n+ drain region 5 are formed at the surface of the p well region 3. In addition, a structure that moderates the electrical field of the PN junction between the n+ drain region 5 and p well region 3 is provided by forming an n offset region 6 of comparatively low concentration surrounding the n+ drain region 5. A gate electrode 8 is formed on the other side of a gate oxide film 7 at the surface of the p well region 3 that is sandwiched by the n+ source region 4 and the n offset region 6. A LOCOS oxide film 19 that is thicker than the gate oxide film 7 is formed at the edge of the gate electrode 8 on the drain side, with the object of moderating the electrical field directly below the gate electrode at the side edge. Also, a p+ contact region 9 is formed at the surface of the p well region 3 adjacent to the n+ source region 4 and is connected to a source electrode 10 in common with the n+ source region 4. In addition, an n+ contact region 12 is formed at the surface of the n well region 2 and is connected with an n well electrode 13.

In such a construction, since the p well region and n well region are both separated from the substrate by a PN junction, there is a high degree of freedom of design in regard to source potential and drain potential, and the construction is applicable to intelligent switching devices, in particular to applications having MOSFETs with a plurality of output stages, where the source potentials and drain potentials thereof are different. It should be noted that, although interlayer insulating films are provided between electrodes of different potential, such as between the gate electrode 8 and the source electrode 10, they are not shown in the following drawings.

Sometimes (see for example Laid-open Japanese Patent Publication Number H. 10-284731) parasitic action of the body diode of a MOSFET is suppressed by providing an embedded n$^+$ region on a p substrate, providing an n epitaxial layer on top of that region, forming a Schottky barrier diode in this portion, and connecting it parallel in the same region with the body diode of the MOSFET.

Also, parasitic action of the body diode may be suppressed (see for example U.S. Pat. No. 4,811,065) by forming a Schottky barrier diode on the surface of the substrate (drain) region of the MOSFET, and connecting it parallel on the same chip with the body diode of the MOSFET.

FIG. 10 is an application circuit diagram of an intelligent switching device comprising a MOSFET with an output stage having a construction as shown in FIG. 9 mentioned above. FIG. 10 is a single phase bridge circuit construction, in which two MOSFETs Q3 and Q1 are connected in series between the power source potential Vcc and reference potential GND and two series-connected MOSFETs Q4 and Q2 are connected in parallel therewith. The load is connected between the connection point of MOSFET Q3 and MOSFET Q1 and the connection point of MOSFETs Q4 and MOSFET Q2; alternate switching between MOSFET Q1 and MOSFETs Q4 on the one hand, and MOSFET Q2 and MOSFET Q3 on the other hand is performed by supplying a signal from a drive circuit, not shown. By means of this switching, current can be made to flow in the load from left to right or in the opposite direction. Commonly, in such a circuit, the load is an inductive load such as a motor. However, in the case of an inductive load, if MOSFETs are employed having the complicated connection structure shown in FIG. 9, problems tend to arise due to parasitic effects.

Figure 11:
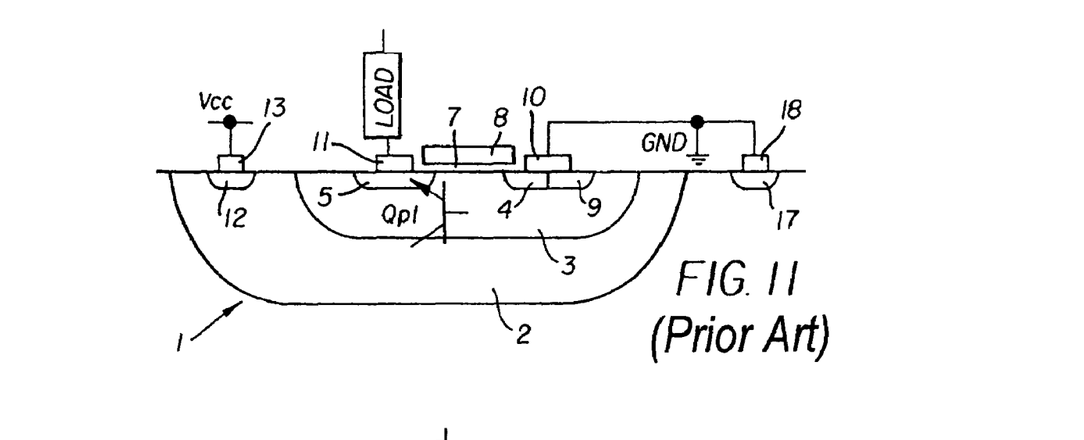
FIG. 11 is a cross-sectional constructional view given in explanation of a parasitic transistor of a prior art MOSFET.

FIG. 11 is a view given in explanation of the parasitic effects when a MOSFET according to FIG. 9 is used for MOSFET Q1 or MOSFET Q2. In FIG. 11, the condition where MOSFET Q3 or MOSFET Q4 are ON corresponds to the case where the n well region 2 of MOSFET Q1 or MOSFET Q2 is connected with Vcc, which is the highest potential. For simplicity of illustration of FIG. 11, the n offset region 6 and LOCOS oxide film 19, etc., shown in FIG. 9 are omitted.

Referring to FIG. 10, while MOSFET Q3 and MOSFET Q2 are ON so that current flows from the left-hand side to the right-hand side of the load (inductive load), if MOSFET Q3 is cut off, an e.m.f. trying to keep the current flowing in the inductive load is generated, causing the potential of the point of connection of MOSFET Q1 and MOSFET Q3 to become lower than the reference potential GND.

Figure 13:
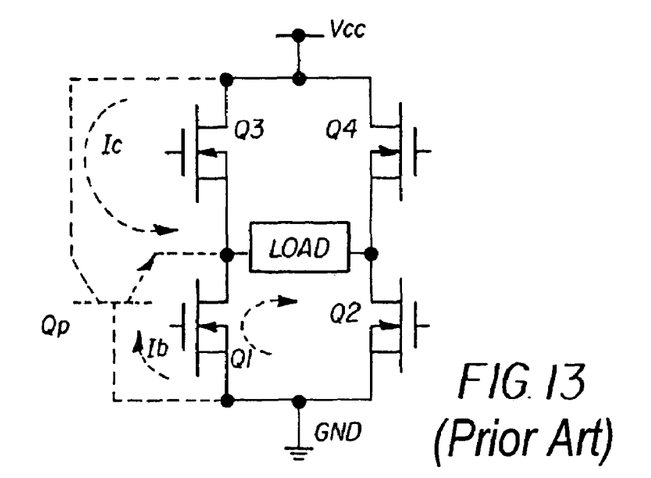
FIG. 13 is an equivalent circuit diagram given in explanation of a parasitic transistor of a prior art MOSFET.

In FIG. 11, when the drain electrode 11 with respect to the source electrode 10 connected to GND potential becomes lower than the threshold voltage (~0.7 V) of the PN junction, the p well region 3 and the PN junction of the n+ drain region 5 is forward-biased, causing base current to flow in the parasitic transistor Qp1 constituted by the n well region 2, the p well region 3 and the n+ drain region 5, causing the collector current of the parasitic transistor Qp1 to flow from Vcc toward the load. FIG. 13 shows this in the form of an equivalent circuit, in which the parasitic transistor Qp1 of FIG. 10 is added as a parasitic transistor Qp and a collector current Ic flows in accordance with the base current Ib.

Figure 12:
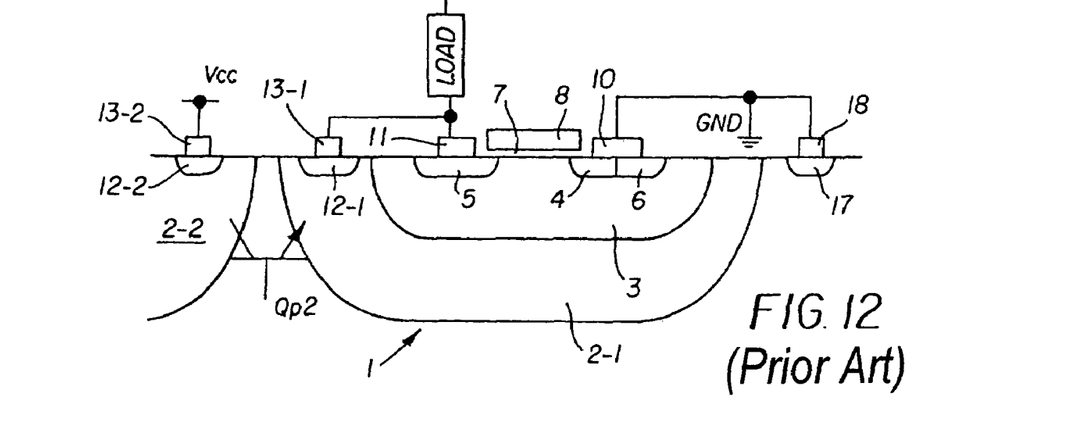
FIG. 12 is a further cross-sectional constructional view given in explanation of a parasitic transistor of a prior art MOSFET.

Furthermore, with a MOSFET of this construction, it is also possible to connect the n well region 2 and drain region 5 by common wiring. FIG. 12 is a view given in explanation of the parasitic effect in this case. In this case, since the n well region 2-1 and the drain region 5 are at the same potential, the parasitic NPN transistor Qp1 in FIG. 11 is basically inactive. However, the PN junction between the p well region 3 and the drain region 5 and the PN junctions between the p well region 3 and the n well region 2-1 and between the p substrate 1 and n well region 2-1 are forward-biased. For example, if a MOSFET n well region 2-2, etc., is present on the high potential side, such as of MOSFET Q3 or MOSFET Q4, etc., in the vicinity of MOSFET Q1, a base current flows in the NPN parasitic transistor Qp2 shown as Qp2 in the FIG., and this parasitic transistor Qp2 is turned ON. If this is illustrated by an equivalent circuit, in the same way as in the case of FIG. 11, Qp2 corresponds to Qp of FIG. 13, and collector current flows from Vcc to the load.

Figure 14:
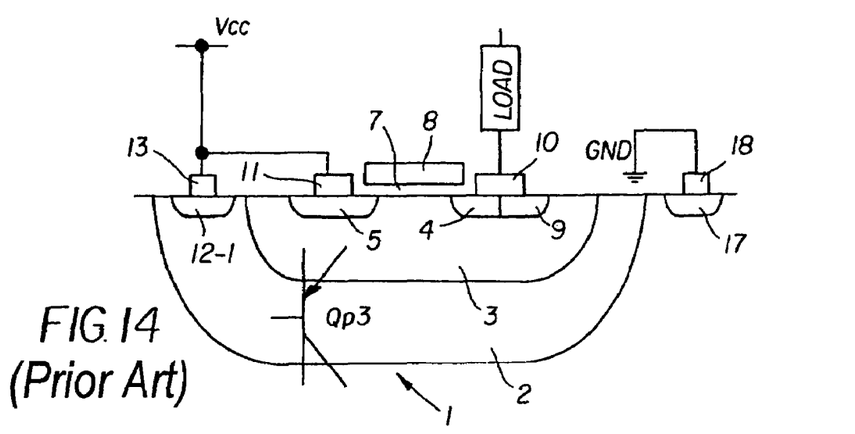
FIG. 14 is yet a further cross-sectional constructional view given in explanation of a parasitic transistor of a prior art MOSFET.
Figure 15:
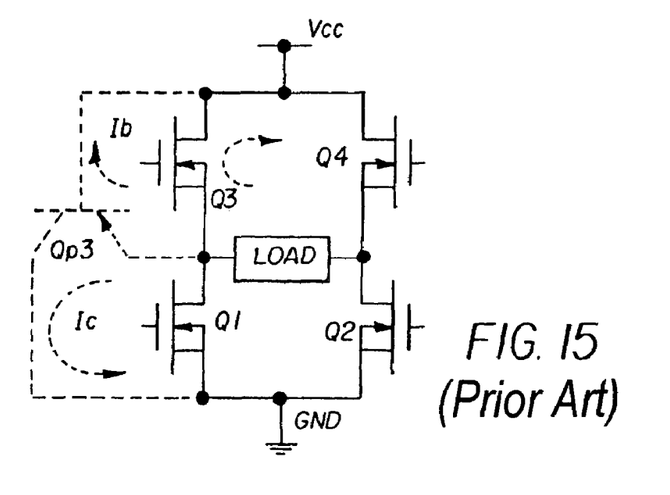
FIG. 15 is a further equivalent circuit diagram given in explanation of a parasitic transistor of a prior art MOSFET.

Next, FIG. 14 is a view given in explanation of the parasitic effect produced in a MOSFET on the high potential side such as MOSFET Q3 or MOSFET Q4. In this case, since the drain of the MOSFET on the high potential side is connected with Vcc, which is the highest potential, a connection construction as shown in FIG. 14 is produced, in which the n well region 2 and drain region 5 are normally connected. First, in the circuit to FIG. 10, while MOSFET Q4 and MOSFET Q1 are ON so that current flows from the left-hand side to the right-hand side of the load, if MOSFET Q1 is cut off, an e.m.f. is generated such as to try to keep the current flowing in the inductive load, so that the source potential of the MOSFET Q3 becomes higher than Vcc. Consequently, in FIG. 14, the PN junctions between the p well region 3 and drain region 5 and between the p well region 3 and n well region 2 are forward-biased so that a base current Ib of the parasitic transistor Qp3 of the PNP in FIG. 14 flows, so that the parasitic transistor Qp3 is turned ON, causing current to flow from the load to GND. The equivalent circuit of this is shown in FIG. 15.

When such a parasitic effect is produced by parasitic transistors, not only can element destruction occur due to current concentration on reverse recovery of the PN junction of minority carriers generated by forward-biasing of the PN junction, but also there is the problem of latching up easily occurring due to various parasitic elements which exist in CMOS circuit for example.

SUMMARY OF THE INVENTION

The present invention relates to a semiconductor device where a power semiconductor element and its drive circuit and protection circuit are integrated on the same chip. More specifically, the present invention relates to an intelligent semiconductor device where a Schottky barrier diode is incorporated to suppress parasitic transistor action of the power semiconductor element.

One aspect of the present invention is a semiconductor device having a transistor comprising a semiconductor substrate of a first conductivity type, at least one first semiconductor region of a second conductivity type formed on a first main surface of the semiconductor substrate. A second semiconductor region of the first conductivity type is formed within the first semiconductor region. A drain region of the second conductivity type and a source region of the second conductivity type are formed within the second semiconductor region. A gate insulating film is formed on the surface of the second semiconductor region and positioned between the drain region and the source region. A gate electrode is formed on the gate insulating film. A source electrode is connected to the semiconductor region of the first conductivity type and the source region. A drain electrode is connected to the drain region. A Schottky barrier diode having a cathode electrode connected to the drain electrode and an anode electrode connected to the source electrode are provided on the semiconductor substrate.

The Schottky barrier diode comprises an anode electrode and cathode electrode at the surface of the first semiconductor region, the anode electrode forming a Schottky junction with the first semiconductor region, and the cathode electrode forming an ohmic contact with the first semiconductor region. The drain region can comprise a high-concentration drain region of comparatively high concentration and an offset region of comparatively low concentration covering the high-concentration drain region. The anode electrode can form the Schottky junction with the offset region.

The semiconductor can further have a contact region of the second conductivity type formed at the surface of the first semiconductor region, and the ohmic contact is formed at the contact region. The Schottky junction and the ohmic contact can be proximate to each other.

The source electrode can be comb-shaped having a base portion forming a source collector electrode section. The Schottky junction can be formed directly below the source collector electrode section. A guard ring region of the first conductivity type can be formed at the periphery of the Schottky junction.

According to another aspect of the invention, a semiconductor device has a transistor comprising a semiconductor substrate of a second conductivity type and a first semiconductor region of a first conductivity type formed on a first main surface of the semiconductor substrate. A drain region of the second conductivity type and a source region of the second conductivity type are formed within the first semiconductor region. A gate insulating film is formed on the surface of the first semiconductor region and positioned between the drain region and the source region. A gate electrode is formed on the gate insulating film. A source electrode is connected to the first semiconductor region and the source region. A drain electrode is connected to the drain region. A Schottky barrier diode having a cathode electrode connected to the drain electrode and an anode electrode connected to the source electrode is provided on the semiconductor substrate.

The semiconductor device can further includes a second semiconductor region of the second conductivity type formed within the first semiconductor region. The Schottky barrier diode comprises an anode electrode and cathode electrode formed at the surface of the second semiconductor region. The anode electrode forms a Schottky junction with the second semiconductor region and the cathode electrode forms an ohmic contact with the second semiconductor region. A contact region of the second conductivity type can be formed at the surface of the second semiconductor region. The ohmic contact is formed at the contact-region. The Schottky junction and the ohmic contact can be proximate to each other. The source electrode can be comb-shaped having a base portion forming a source collector electrode section. The Schottky junction can be formed directly below the source collector electrode section constituting the base of the comb.

The drain region can comprise a high-concentration drain region of comparatively high concentration and an offset region of comparatively low concentration covering the high-concentration drain region. A guard ring region of the first conductivity type can be formed at the periphery of the Schottky junction.

According to another aspect of the invention, a semiconductor device has a semiconductor substrate of a first or second conductivity type, a first semiconductor region of the second conductivity type formed on a first main surface of a semiconductor substrate, and a second semiconductor region of the first conductivity type formed at the surface of the first semiconductor region. An offset region of the second conductivity type is formed in the second semiconductor region. An anode electrode and a cathode electrode are formed at the surface of the offset region. The cathode electrode forms an ohmic contact with the offset region and the anode electrode forms a Schottky junction with the offset region. A field oxide film is formed at the surface of the offset region positioned between the anode electrode and the cathode electrode.

The semiconductor device can further include a first electrode connected to the anode electrode and forms an ohmic contact with the second semiconductor region at the surface thereof. It can further include a second electrode connected to the cathode electrode and forms an ohmic contact with the second semiconductor region at the surface thereof, the second electrode being connected to the cathode electrode.

The total impurity dosage per unit area of the offset region can be set such that, when voltage is applied to the anode electrode and between the first electrode and the cathode electrode in the direction in which the Schottky junction directly below the anode electrode is reverse-biased, and the first PN junction between the second semiconductor region and the offset region is reverse-biased, the offset region positioned between the anode electrode and the cathode electrode is totally depleted at a voltage equal to or below the breakdown voltage of the Schottky junction. Moreover, the total impurity dosage per unit area of the second semiconductor region can be set such that, when voltage is applied to the cathode electrode and between the second electrode and the first electrode in the direction in which the first PN junction is reverse-biased, and the second PN junction between the second semiconductor region and the first semiconductor region is reverse-biased, the second semiconductor region directly below the region positioned between the anode electrode and the cathode electrode is totally depleted at a voltage below the breakdown voltage of the first PN junction or the second PN junction.

The semiconductor can be configured to suppress parasitic effects by forward biasing a PN junction capable of being biased in the forwards direction so that minority carriers are not generated, and by connecting a Schottky barrier diode, constituting a majority carrier device, in parallel with the PN junction. The Schottky barrier diode connected in parallel with the PN junction capable of being forward-biased keeps the forward voltage thereof below the threshold voltage of the PN junction and thereby prevents parasitic effects and prevent destruction of elements and/or miss-operation of the circuit by parasitic effects caused by parasitic transistors.

DETAILED DESCRIPTION

Figure 1:
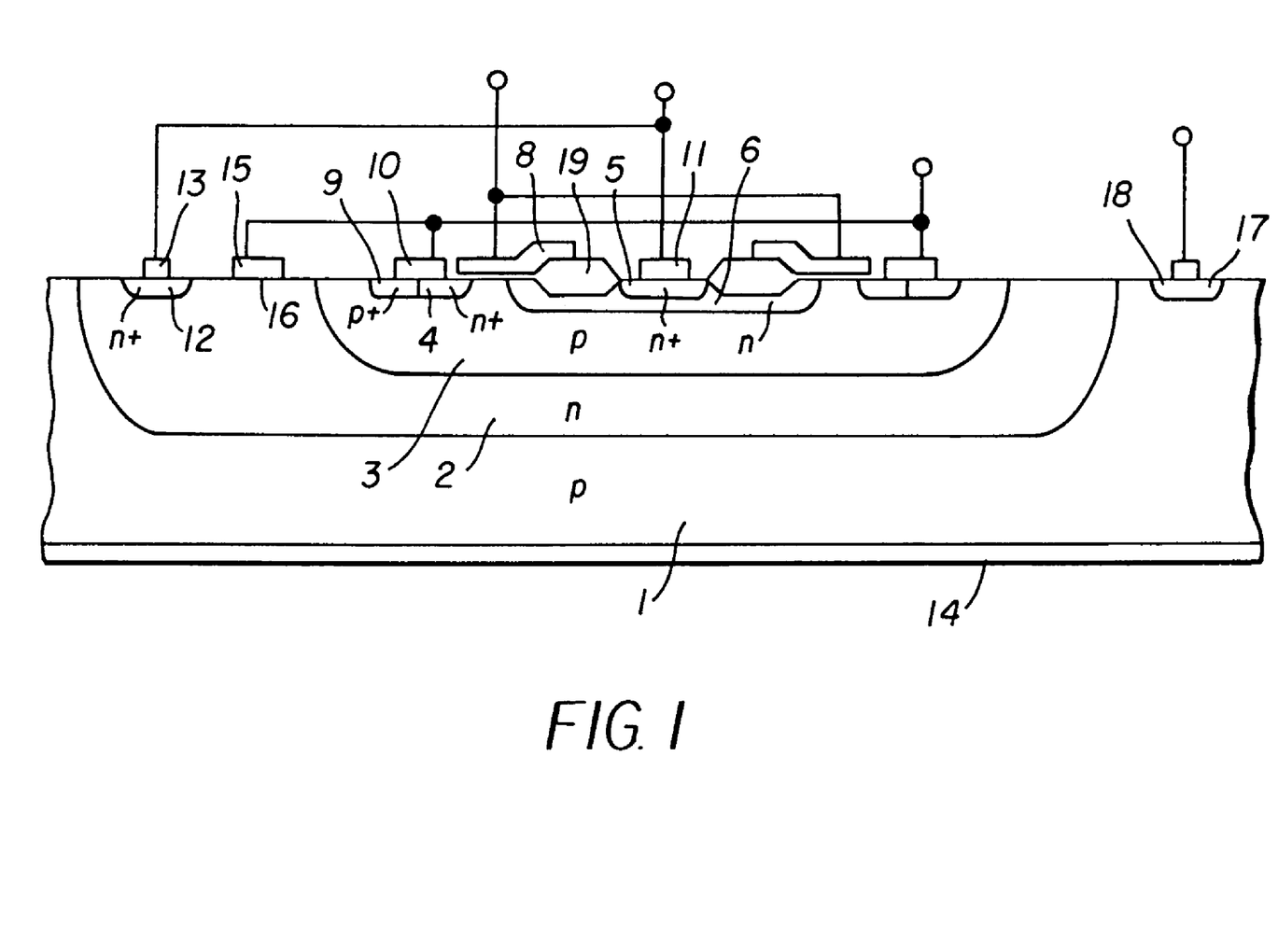
FIG. 1 is a cross-sectional constructional view illustrating the concept of a MOSFET incorporating a Schottky barrier diode according to a first embodiment of the present invention.

FIG. 1 is a cross-sectional constructional view illustrating the concept of a MOSFET incorporating a Schottky barrier diode according to a first embodiment of the present invention. The difference between FIGS. 1 and 9 is that FIG. 1 has an anode electrode 15 formed at the surface of the n well region 2 and a Schottky junction 16 formed at the interface with the n well region 2. In this embodiment, the n well electrode 13 formed on the $n^+$ contact region 12 is connected with the drain electrode 11 and the anode electrode 15 is connected with the source electrode 10, respectively, by means of wiring, so the Schottky barrier diode constituted by the anode electrode 15 and the n well region 2 is connected in parallel with the PN junction constituted by the p well region 3 and the drain region 5 (through the n offset region 6), so that the base current of the parasitic transistor is bypassed by the Schottky barrier diode, thereby making it possible to suppress the parasitic transistor effect. It should be noted that, although, in this embodiment, only a single n well region 2 on the p type semiconductor substrate 1 is illustrated, in the case of an application circuit, such as that of FIG. 10, a plurality of n well regions 2 can be provided for each MOSFET. Also, in cases where it is sufficient for the potentials of the n well regions to be of a single type, the p type semiconductor substrate 1 and n well regions 2 can be replaced by an n substrate, the p well 3 being formed on this n substrate. In this case, the n substrate potential can be made to have the same potential as that of the n well region 2 of this embodiment. Also, although, in this embodiment, the anode and cathode electrodes of Schottky barrier diode are formed in a region common with the n well region formed by the MOSFET, they can be formed on another n well region.

Figure 2:
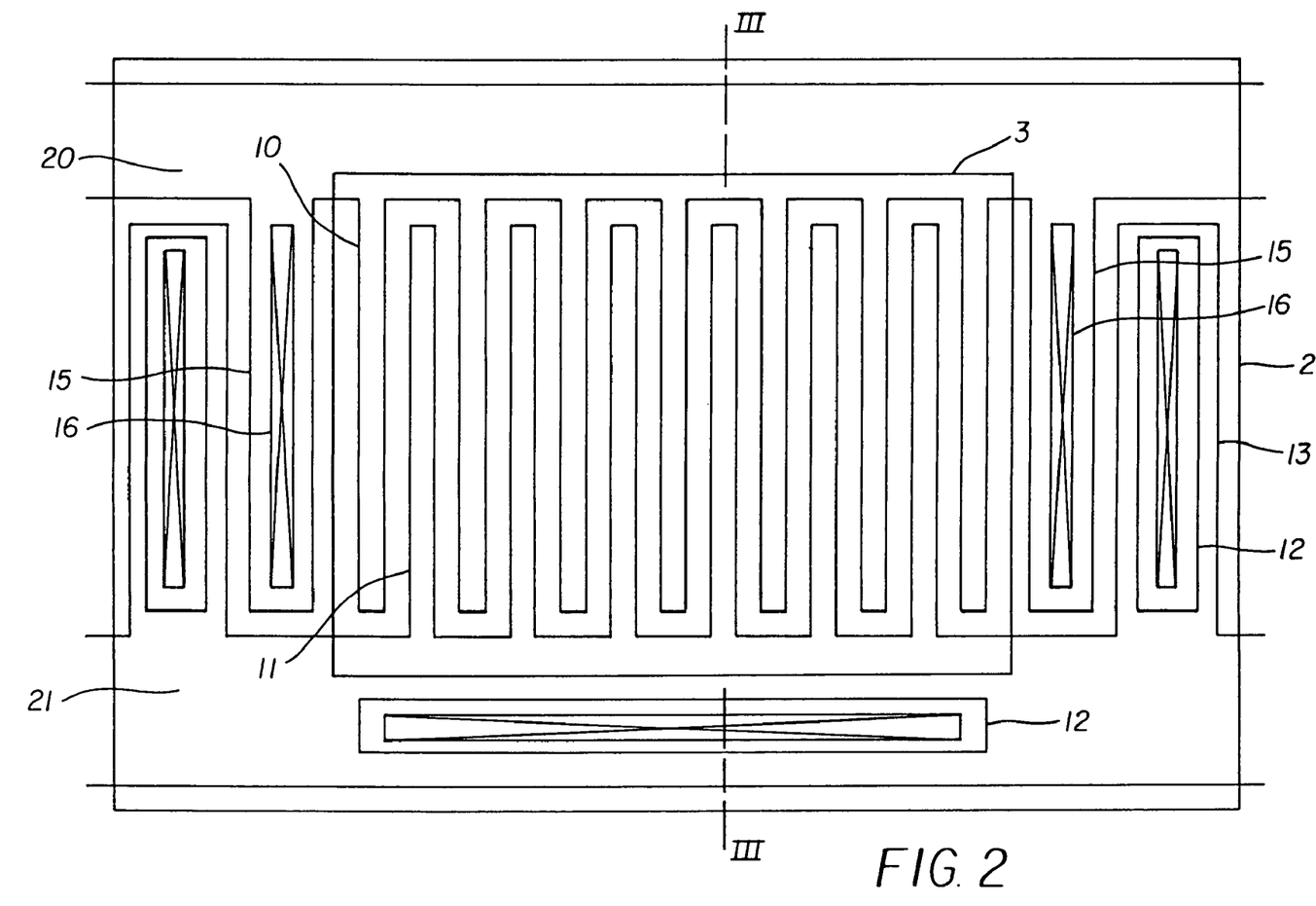
FIG. 2 is a plan constructional view of a MOSFET incorporating a Schottky barrier diode according to a first embodiment of the present invention.
Figure 3:
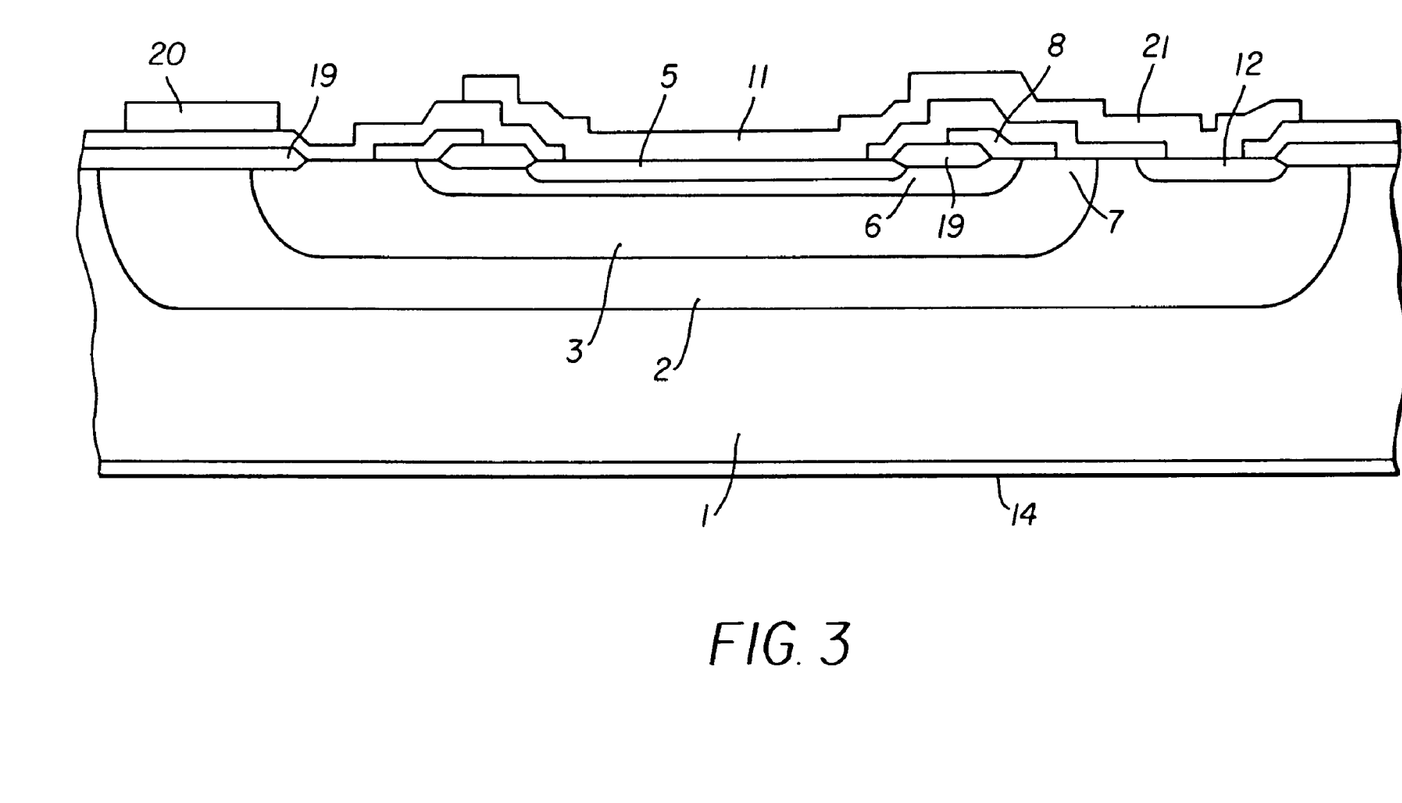
FIG. 3 is a cross-sectional view taken along line III-III of FIG. 2.

FIG. 2 is a plan constructional view of a MOSFET incorporating a Schottky barrier diode for realizing a construction according to the concept of FIG. 1 in the first embodiment. Also, FIG. 3 is a cross-sectional constructional view along the line III-III of FIG. 2. In FIGS. 2 and 3, comb-shaped electrodes are constituted by an alternate arrangement of source electrodes and drain electrodes in FIG. 1 in the p well region 3 in the n well region 2. An anode electrode 15 is connected with the n well region 2 and is connected with the source electrode 10 through a source current collecting electrode 20; an n well electrode 13 is connected with a collector region 12 and is connected with a drain electrode 11 through a drain current collecting electrode 21. A Schottky junction 16 is formed at the bottom of the anode electrode 15 separated from the p well region 3 by a distance such that punch-through does not occur and an $n^+$ contact region 12 is formed facing the Schottky junction 16 and adjacent thereto with a separation capable of ensuring the necessary voltage-withstanding ability. By making this separation as small as possible in a range such that the necessary voltage-withstanding ability can be maintained, the forward voltage drop of the Schottky barrier diode can be reduced and the area of the Schottky barrier diode required to suppress parasitic effects can be reduced.

Also, with this construction of the embodiment, since it is not possible for the current flowing in the Schottky barrier diode to flow through the n well region 2 directly below the p well region 3, the voltage drop in the n well region directly below the p well region produced by this current prevents the pn junction of the p well region and n well region being forward-biased and is therefore advantageous in suppressing parasitic effects. It should be noted that, although, in this embodiment, the Schottky junction 16 was formed in a position sandwiched by the $n^+$ contact region 12 and the p well region 3, it would alternatively be possible for the $n^+$ contact region 12 to be formed in a position sandwiched by the Schottky junction 16 and the p well region 3. Or, if required, the n$^+$ contact region 12 and the Schottky junction 16 can be arranged alternately. By thus forming the Schottky junction 16 in the n well region 2 rather than in the drain region (n offset region), the Schottky barrier diode can be formed in the MOSFET peripheral region, thereby facilitating wiring. Consequently, the forward voltage of the Schottky barrier diode can be kept to a satisfactory low level, thereby making it possible to prevent the occurrence of parasitic effects due to forward-biasing of the PN junction.

With the first embodiment, since the n well region is connected with the drain, the Schottky junction being formed on the n well region rather than the drain of a transverse type MOSFET, a Schottky junction of comparatively large area can easily be formed. Also, since the n well region is deeper and of lower concentration than the n offset region, the Schottky barrier diode voltage-withstanding ability can easily be made greater than the voltage-withstanding ability of the MOSFET, so that there is no possibility of the voltage-withstanding ability between the source and drain of the MOSFET being restricted by the voltage-withstanding ability of the Schottky barrier diode that is connected in parallel therewith.

Figure 4:
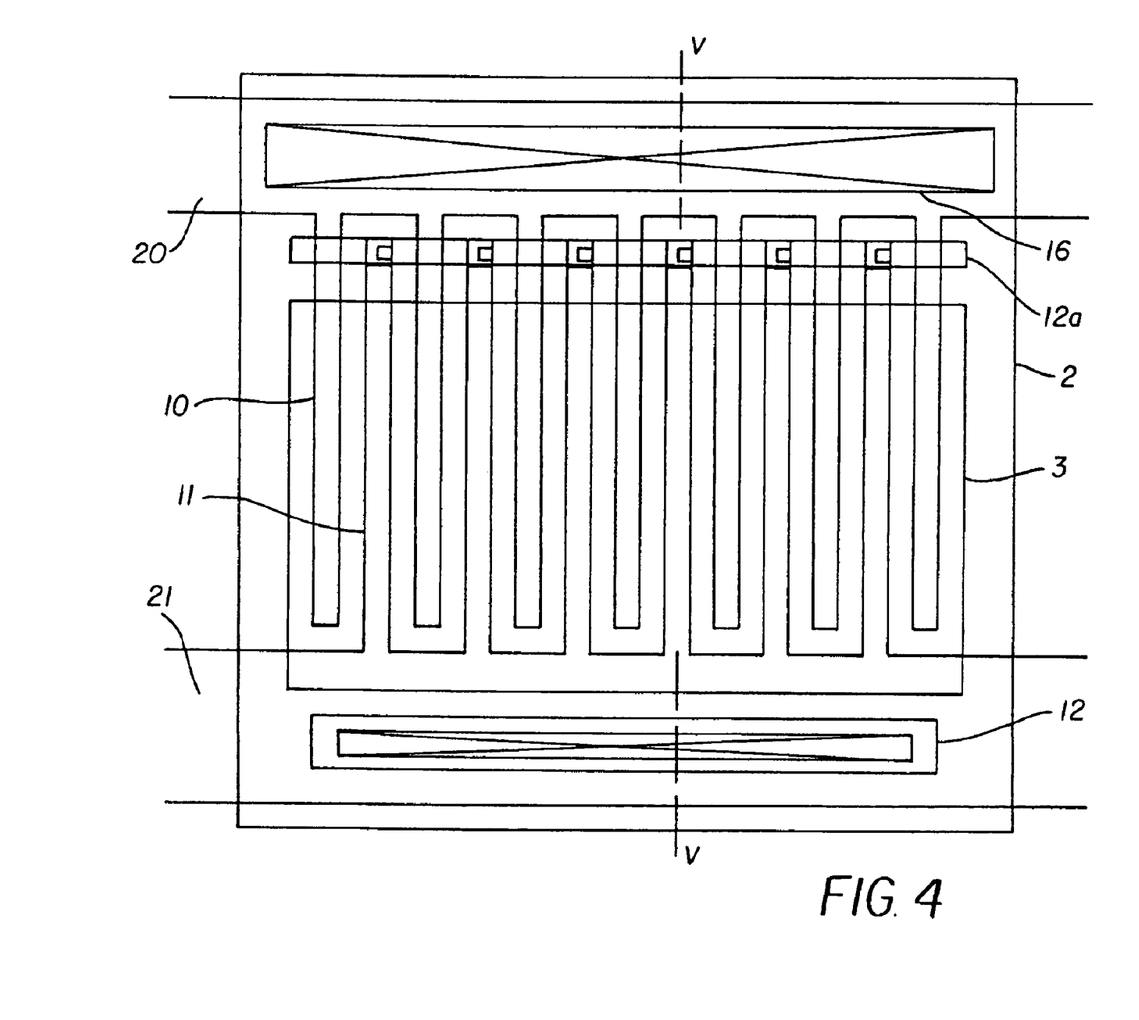
FIG. 4 is a plan constructional view of a MOSFET incorporating a Schottky barrier diode according to a second embodiment of the present invention.
Figure 5:
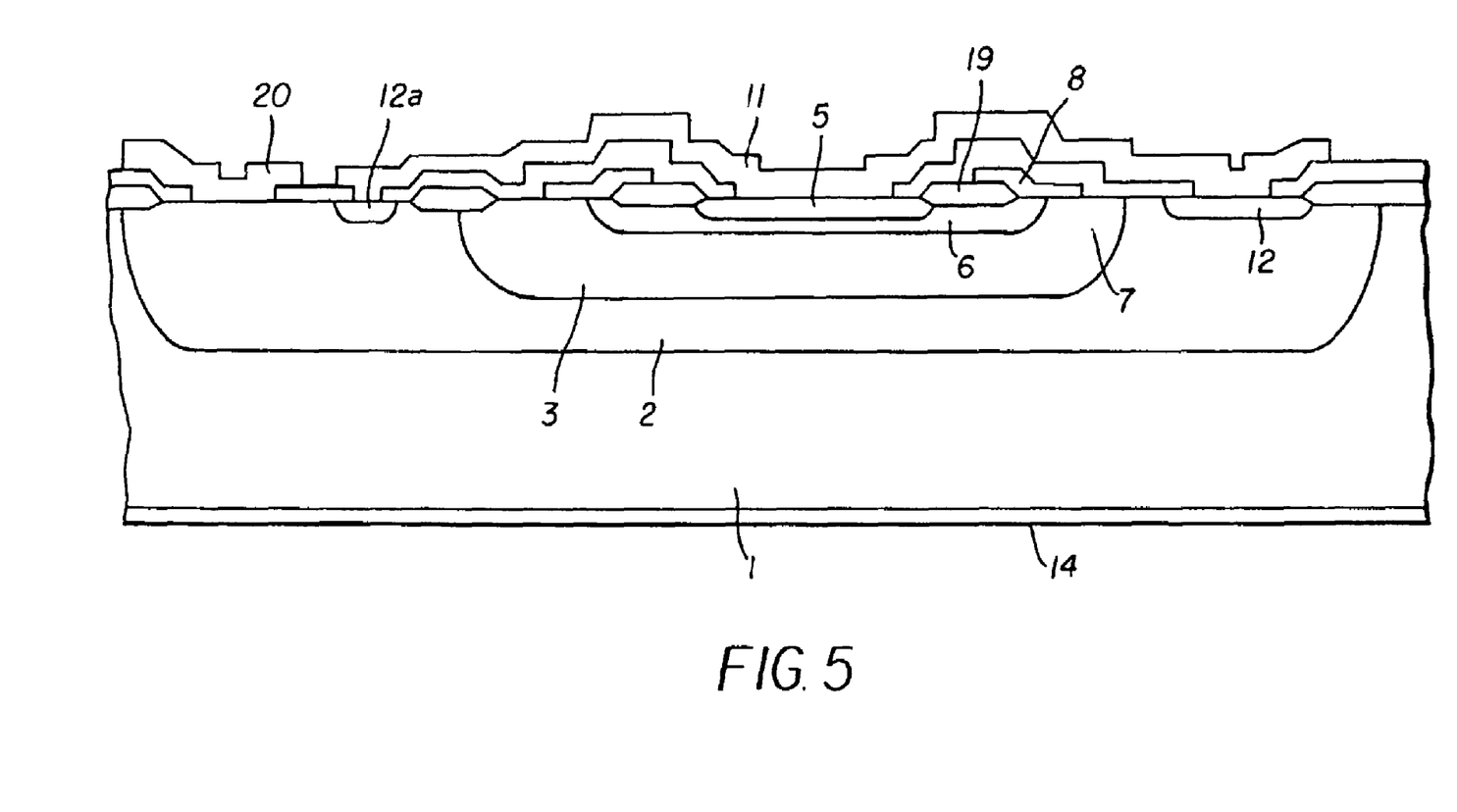
FIG. 5 is a cross-sectional view along line V-V of FIG. 4.

FIG. 4 is a plan constructional view of a MOSFET incorporating a Schottky barrier diode according to a second embodiment of the present invention and FIG. 5 is a cross-sectional view along the line V-V of FIG. 4. The points of difference between this FIG. 4 and FIG. 5 with regard to FIG. 2 are that the Schottky junction 16 is formed directly below the region of the source current collector electrode 20 and that an n$^+$ contact region 12*a* is provided in the vicinity of the source current collector electrode 20, being directly connected with the drain electrode at a tip portion thereof constituted by extending the drain electrode 11 from the drain current collector electrode 21. Since the source current collector electrode or drain current collector electrode must collect and allow passage of current from a large number of MOSFET cells, its wiring must be made comparatively wide. Consequently, if a Schottky barrier diode that requires a comparatively large area is formed in the region of such a source current collector electrode 20, it is not necessary to form a special region simply for forming the Schottky barrier diode; this is therefore effective in reducing the chip size. It should be noted that, in this embodiment, since the connection to the drain electrode is made by providing the n$^+$ contact region 12*a* in the vicinity of the Schottky junction 16, the distance between the Schottky junction 16 and the n$^+$ contact region 12*a* is reduced and the forward voltage drop of the Schottky barrier diode is reduced while maintaining the necessary voltage-withstanding ability.

Also, it is of course possible to ensure the desired area of the Schottky barrier diode by combining the arrangement construction of the Schottky junction of FIG. 2 and the arrangement construction of the Schottky junction of FIG. 4. With the second embodiment, the Schottky junction is formed directly below the wiring of the source current collector electrode, so that the Schottky barrier diode can be formed in an area-efficient manner.

Figure 6:
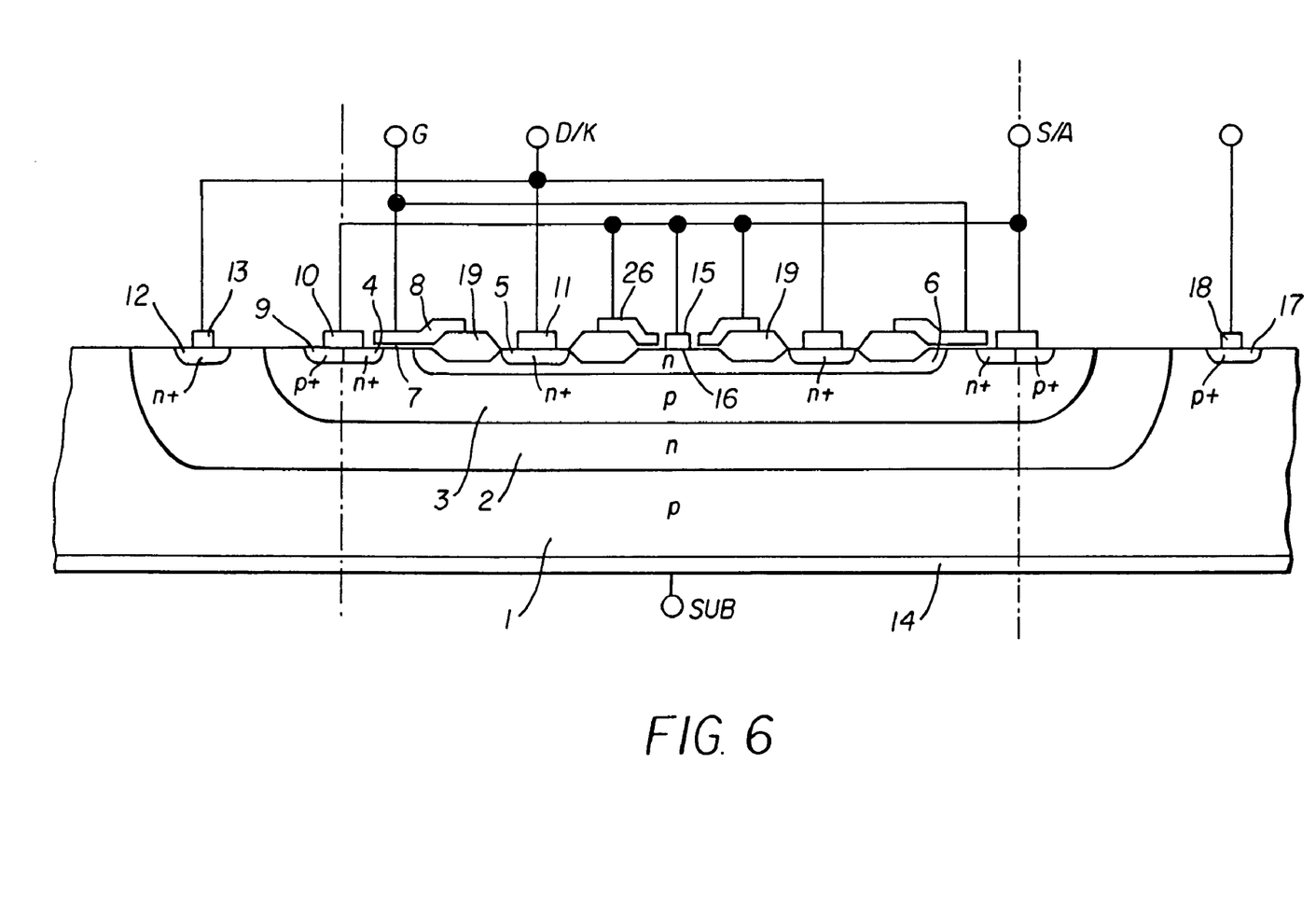
FIG. 6 is a cross-sectional constructional view illustrating the concept of a MOSFET incorporating a Schottky barrier diode according to a third embodiment of the present invention.

FIG. 6 is a cross-sectional constructional view illustrating the concept of a MOSFET incorporating a Schottky barrier diode according to a third embodiment of the present invention. The point of difference from FIG. 1 is that the Schottky junction 16 is formed on the n offset region 6 (drain) rather than the surface of the n well region 2, the anode electrode 15 being connected by wiring with the source electrode 10. If the Schottky junction 16 is formed in the surface of the n well region 2, as in the first embodiment, in order to bypass the PN junction between the p well region 3 and the n$^+$ drain region 5 (through the n offset region 6) of the MOSFET by a Schottky barrier diode, the n$^+$ drain region 5 and the n well region 2 must be connected by a common electrode, as shown in FIG. 12. However, with the present embodiment, since a construction is adopted in which the Schottky barrier diode is connected directly between the source and drain of the MOSFET, the advantage is obtained so that this is capable of being applied even in the case of a circuit connection as shown in FIG. 11. It should be noted that, although in all of the embodiments, including the present embodiment, the p guard ring region and/or field plate region constituting the voltage-withstanding structure surrounding the periphery of the Schottky junction, which is usually employed for ensuring a stable voltage-withstanding ability of the Schottky junction, is not shown in the drawings, use of such a guard ring structure is of course effective. In the third embodiment, the Schottky junction is formed in the n offset region, so that it is not necessary to make the potential of the n well the drain potential; circuit design restrictions can thereby be reduced. In this construction, the cathode electrode can be shared with the drain electrode of the MOSFET, this is effective in reducing the chip area.

Figure 7:
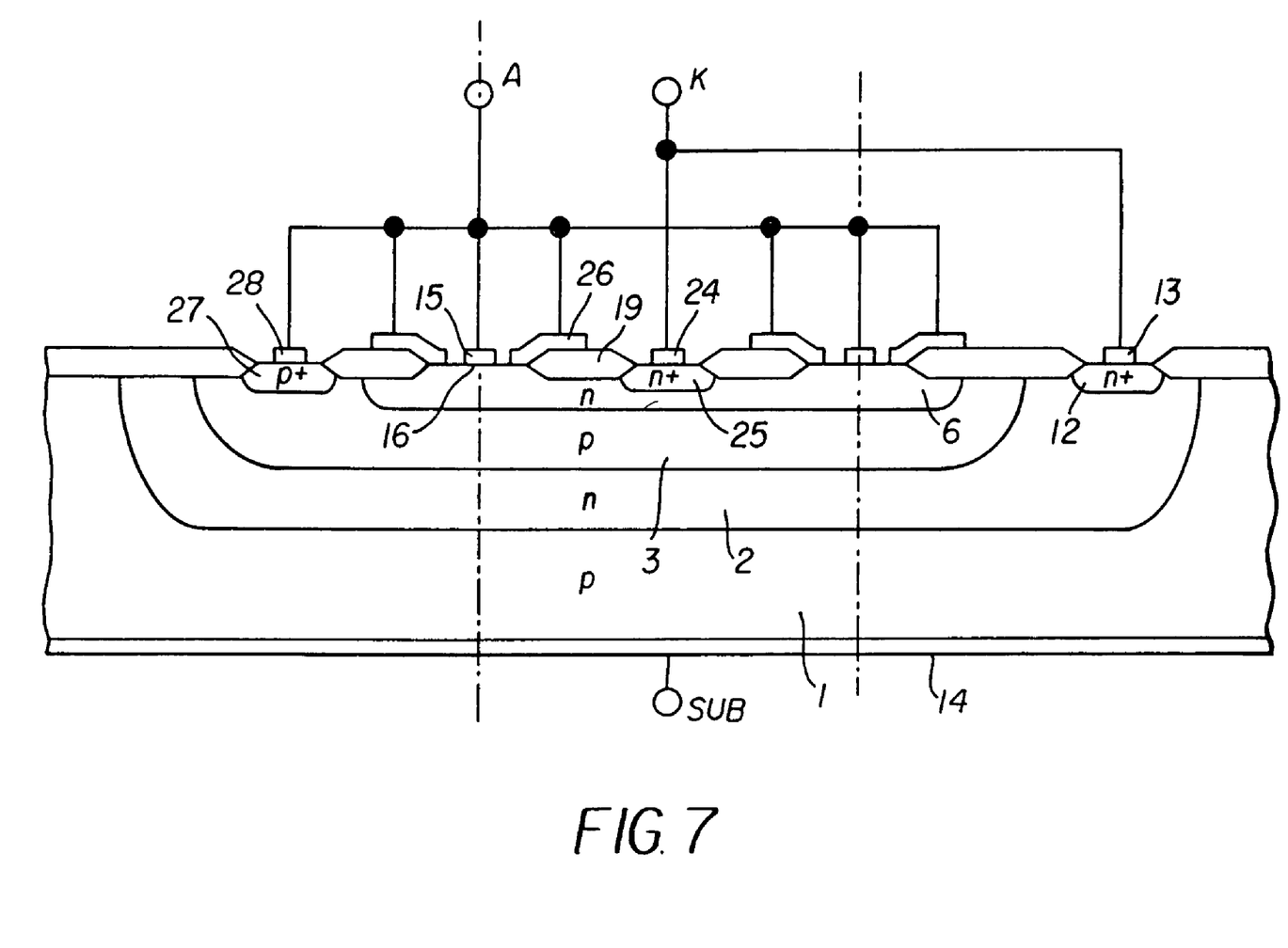
FIG. 7 is a cross-sectional constructional view illustrating the concept of a Schottky barrier diode according to a fourth embodiment of the present invention.

FIG. 7 is a cross-sectional constructional view illustrating the concept of a Schottky barrier diode according to a fourth embodiment of the present invention, in which an n well region 2 is formed at the surface of the p type semiconductor substrate 1 and, in addition, a p well region 3 is formed at the surface of the n well region 2. An n offset region 6 is formed at the surface of the p well region 3 and at the surface thereof there are formed an anode electrode 15 and cathode electrode 24, separated by a prescribed distance depending on the voltage-withstanding ability. The anode electrode 15 forms the n offset region 6 and the Schottky junction 16, and directly below the cathode electrode 24 there is formed an n$^+$ cathode region 25 for forming an ohmic contact with the cathode electrode 24. Also, at the surface of the n offset region 6, which is sandwiched by the anode electrode 15 and cathode electrode 24, a LOCOS oxide film 19 and a polysilicon field plate 26 are formed with the object of moderating the electrical field in the vicinity of the anode electrode. The p well region 3 and n well region 2 are respectively connected with the p well electrode 28 and n well electrode 13 through a p well contact region 27 and n$^+$ contact region 12.

Since the n offset region 6 is formed by the uppermost surface diffusion of the triple diffusion, it is difficult to achieve sufficiently deep diffusion. Consequently, in order to obtain sufficient voltage-withstanding ability and low forward resistance, it is desirable to employ the so-called RESURF conditions (total impurity dosage per unit area 1E12 cm$^2$) for the concentration and depth of the n offset region 6. In this case, it is necessary for the cathode electrode 24 and p well region 3 to be in a withstand-voltage maintaining condition, i.e., reverse biased during reverse biasing of the Schottky junction. Furthermore, in order to prevent flow of punch-through current between the anode electrode 15 and p well region 3, it is desirable to make the potential of the p well electrode 28 and the potential of the anode electrode 15 the same potential. Consequently, in this embodiment, the p well electrode 28 and the anode electrode 15 are connected by wiring.

Furthermore, in the case of the p well region 3 also, since this is a diffusion region within the n well region 2, it is likewise difficult to achieve sufficiently deep diffusion. Consequently, in order to obtain a sufficiently large voltage-withstanding ability, it is desirable to employ so-called double RESURF conditions (total impurity dosage per unit area 2E12 cm²) for the concentration and depth of the p well region 3. In this case also, likewise, in order to achieve reverse biasing between the n well region 2 and the p well region 3, and prevent flow of punch-through current between the cathode electrode 24 and the n well region 2, it is desirable to make the n well electrode 13 and the cathode electrode 24 of the same potential. Consequently, in this embodiment, the cathode electrode 24 and the n well electrode 13 are connected by wiring.

In the case of the n well region 2, since this is not formed within an even deeper diffusion region, it is comparatively easy to achieve low concentration diffusion. However, when high voltage-withstanding ability is required, it is likewise effective to employ double RESURF conditions (total impurity dosage 2E12 cm²) for the concentration and depth of the n well region 2. Likewise, in this case, in order to prevent punch-through, and to reverse-bias the n well region 2 and the p type semiconductor substrate 1, it is effective to make the back face electrode 14 and the p well electrode 28 of the same potential. Also, this construction is useful in that, by forming these on the same substrate with a transverse type MOSFET and respectively connecting the drain electrode 11 and cathode electrode 24, as well as the source electrode 10 and the anode electrode 15 by short wirings, inductance is reduced to a minimum, making it possible to effectively suppress the action of parasitic diodes and parasitic transistors of the MOSFET. Also, by making the manufacturing conditions of the n well region, the p well region, and the n offset region, etc., common for the MOSFET and the Schottky barrier diode, the voltage-withstanding ability and ON resistance (forward voltage) of the MOSFET and the Schottky barrier diode can be simultaneously optimized. By making this construction a comb-shaped construction by adopting a striped configuration in the depth direction of the cross-sectional view and by repeating the construction between the two single-dotted chain lines in the figures as the pitch, the forward resistance can of course be reduced. This applies also to the other embodiments.

This construction can also be formed within the same n well region as the lateral MOSFET or can be formed in a different n well region. Forming this within the same n well region is advantageous in that the area occupied within the chip can be reduced. However, by forming in separate n well regions, it becomes possible to make the potentials of the n well regions different. This is therefore effective in suppressing parasitic effects other than of the MOSFET, such as, for example, suppression of parasitic effects when the input potential drops from the reference potential to below the threshold voltage of the PN junction or when it becomes higher than the power source voltage by more than the threshold voltage of the PN junction, by employing a Schottky diode of this construction in a parallel connection with or as a replacement for the input protection PN diode.

Figure 8:
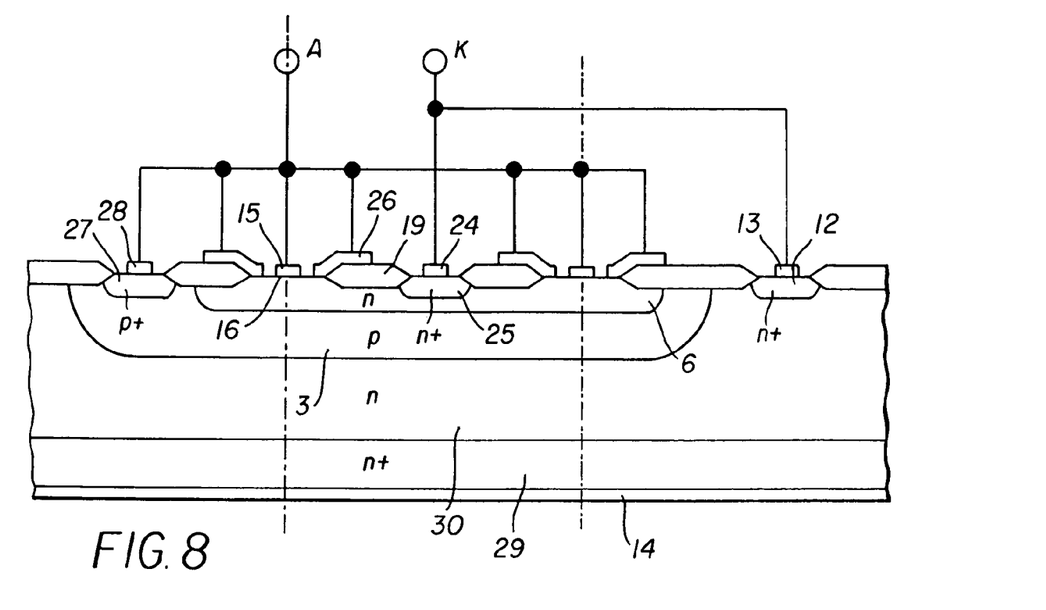
FIG. 8 is a cross-sectional constructional view illustrating the concept of a MOSFET incorporating a Schottky barrier diode according to a fifth embodiment of the present invention.

FIG. 8 shows a fifth embodiment of the present invention, its difference from FIG. 7 being that an n⁺ type semiconductor substrate 29 is provided in place of the p type semiconductor substrate 1 and an n type semiconductor layer 30 is formed instead of the n well region. In contrast to the fourth embodiment, this embodiment is useful in applications where different n well potentials are not necessary. Just as in the case of the fourth embodiment, it is effective to employ respectively RESURF and double RESURF conditions for the n offset region 6 and p well region 3 and to connect the anode electrode 15 and the p well electrode 28 and also the cathode electrode 24 and the n well electrode 13. However, since the n type semiconductor layer 30 has no p type semiconductor substrate, it is effective to design this to have a concentration such that the junction voltage-withstanding ability between the p well region 3 and the n well semiconductor layer 30 is not greatly inferior to the voltage-withstanding ability of the Schottky diode.

With the present invention, the inconveniences due to parasitic effects tending to be produced with an inductive (L) load by the complicated junction construction when a plurality of MOSFETs of different terminal potentials are integrated within a single semiconductor chip can be prevented, i.e., parasitic effects of parasitic transistors can be prevented, by insertion of a Schottky barrier diode between the source and drain or between the source and n well region of the MOSFETS. Thus, since a Schottky barrier diode is formed on the same semiconductor chip as the MOSFET, it can easily be accommodated in the package, making it possible to reduce the installation area. Also, since the forward-biased pn junction of the MOSFET can be bypassed by a Schottky barrier diode in the vicinity thereof, there is no possibility of current bypassing to the Schottky barrier diode being obstructed due to the inductance of the wiring.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosures of the priority applications, JP PA-2001-355798 and JP PA-2002-262230, in their entirety, including the drawings, claims, and the specification thereof, are incorporated herein by reference.

What is claimed is:

1. A semiconductor device comprising:
   a semiconductor substrate of one of a first or second conductivity type;
   a first semiconductor region of the second conductivity type formed on a first main surface of the semiconductor substrate;
   a second semiconductor region of the first conductivity type formed at the surface of the first semiconductor region;
   an offset region of the second conductivity type formed in the second semiconductor region;
   a Schottky electrode and an ohmic electrode formed at the surface of the offset region, wherein the ohmic electrode forms an ohmic contact with the offset region and the Schottky electrode forms a Schottky junction with the offset region; and
   a first electrode that forms an ohmic contact with the second semiconductor region at the surface thereof, the first electrode being electrically connected to the Schottky electrode.

2. The semiconductor device according to claim 1, wherein the impurity concentration of the offset region is such that, when voltage is applied to the Schottky electrode and between the first electrode and the ohmic electrode in the direction in which the Schottky junction directly below the Schottky electrode is reverse-biased, and a first PN junction between the second semiconductor region and the offset region is reverse-biased, the offset region positioned between the Schottky electrode and the ohmic electrode becomes totally depleted at a voltage equal to or below the breakdown voltage of the Schottky junction.

3. The semiconductor device according to claim 1, wherein a field oxide film is formed at the surface of the offset region positioned between the Schottky electrode and the ohmic electrode.

4. The semiconductor device according to claim 1, further comprising a second electrode that forms an ohmic contact with the first semiconductor region at the surface thereof, the second electrode being connected to the ohmic electrode.

5. The semiconductor device according to claim 4, wherein the impurity concentration of the second semiconductor region is such that, when voltage is applied to the ohmic electrode and between the second electrode and the first electrode in the direction in which a first PN junction is reverse-biased, and a second PN junction between the second semiconductor region and the first semiconductor region is reverse-biased, the second semiconductor region directly below the region positioned between the Schottky electrode and the ohmic electrode becomes totally depleted at a voltage below the breakdown voltage of the first PN junction or the second PN junction.

* * * * *